(12) United States Patent
Grieshofer et al.

(10) Patent No.: US 8,833,668 B2
(45) Date of Patent: Sep. 16, 2014

(54) CHIP CARD CONTACT ARRAY ARRANGEMENT

(71) Applicant: Infineon Technologies AG, Neubiberg (DE)

(72) Inventors: Thomas Grieshofer, Rottenmann (AT); Peter Raggam, St. Stefan/R. (AT); Andreas Woerle, Graz (AT)

(73) Assignee: Infineon Technologies AG, Neubiberg (DE)

( * ) Notice: Subject to any disclaimer, the term of this patent is extended or adjusted under 35 U.S.C. 154(b) by 91 days.

(21) Appl. No.: 13/711,707

(22) Filed: Dec. 12, 2012

(65) Prior Publication Data

US 2013/0146670 A1    Jun. 13, 2013

(30) Foreign Application Priority Data

Dec. 13, 2011   (DE) .......................... 10 2011 056 326

(51) Int. Cl.
    *G06K 19/07*    (2006.01)
    *G06K 19/077*   (2006.01)
    *H05K 1/02*     (2006.01)

(52) U.S. Cl.
    CPC ........ *H05K 1/0296* (2013.01); *G06K 19/07769* (2013.01); *G06K 19/07783* (2013.01); *G06K 19/0723* (2013.01)
    USPC ........................................................ 235/492

(58) Field of Classification Search
    CPC .............................................. G06K 19/07783
    USPC ........................................................... 235/492
    See application file for complete search history.

(56) References Cited

U.S. PATENT DOCUMENTS

| | | | | |
|---|---|---|---|---|
| 5,321,240 | A * | 6/1994 | Takahira ....................... | 235/380 |
| 6,400,323 | B2 * | 6/2002 | Yasukawa et al. ..... | 343/700 MS |
| 6,568,600 | B1 | 5/2003 | Carpier et al. | |
| 7,154,758 | B2 | 12/2006 | Welling et al. | |
| 8,366,009 | B2 * | 2/2013 | Finn et al. ..................... | 235/492 |
| 2002/0170974 | A1 * | 11/2002 | Kashima ....................... | 235/492 |
| 2011/0049249 | A1 * | 3/2011 | Kato et al. .................... | 235/492 |
| 2013/0075477 | A1 * | 3/2013 | Finn et al. ..................... | 235/492 |
| 2013/0126622 | A1 * | 5/2013 | Finn ............................... | 235/492 |
| 2013/0134227 | A1 * | 5/2013 | De Maquille et al. ........ | 235/492 |

FOREIGN PATENT DOCUMENTS

| | | |
|---|---|---|
| DE | 20204101 U1 | 8/2002 |
| DE | 10122416 A1 | 11/2002 |

* cited by examiner

*Primary Examiner* — Daniel Hess

(57) ABSTRACT

In various embodiments, a chip card contact array arrangement is provided, having a carrier, a plurality of contact arrays which are arranged on a first side of the carrier, an electrically conductive structure which is arranged on a second side of the carrier, which is arranged opposite the first side of the carrier, a first plated-through hole and a second plated-through hole, wherein the first plated-through hole is coupled to the electrically conductive structure, a connecting structure which is arranged on the first side of the carrier, wherein the connecting structure connects the first plated-through hole to the second plated-through hole, the connecting structure having a longitudinal extent which runs parallel to a direction in which a contact-connection device on a reading device is moved relative to the plurality of contacts.

14 Claims, 9 Drawing Sheets

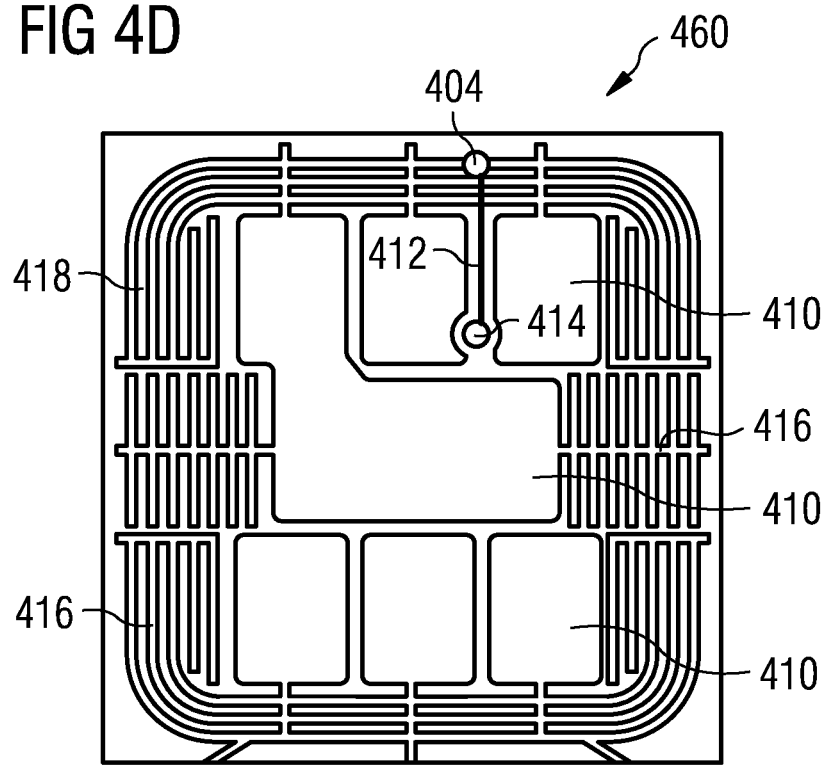

CHIP CARD CONTACT ARRAY ARRANGEMENT

CROSS-REFERENCE TO RELATED APPLICATION

This application claims priority to German Patent Application Serial No. 10 2011 056 326.1, which was filed Dec. 13, 2011, and is incorporated herein by reference in its entirety.

TECHNICAL FIELD

In various embodiments, a chip card contact array arrangement is provided.

BACKGROUND

In chip cards, which are in widespread use in electronic payment transactions, for example, the communication predominantly take place using a contact-based interface in the form of contact arrays which may be present on the surface of the chip card, the position and shape of the contact arrays being able to be prescribed by ISO/IEC standard 7816-2, for example. In order to set up communication between the chip located on the chip card and a reading device, the chip card first of all needs to be singularized—for example by removing it from a wallet—and then introduced into the reading device. This handling of a chip card can be perceived as not very convenient by a user.

A worthwhile extension which solves this problem is provided by what are known as dual interface chip cards, in which the chip can also communicate using a contactless interface in addition to the customary contact-based interface. The contactless interface on the chip card is provided by a chip card antenna which is connected to the chip. In this case, the chip card antenna and the chip may be arranged on the chip card module together. When the chip card antenna and the chip are arranged on the chip card module together, the chip card antenna is also called a CoM (Coil on Module). The chip card antenna or the chip card module antenna may be in the form of a flat coil, for example.

SUMMARY

In various embodiments, a chip card contact array arrangement is provided, having a carrier, a plurality of contact arrays which are arranged on a first side of the carrier, an electrically conductive structure which is arranged on a second side of the carrier, which is arranged opposite the first side of the carrier, a first plated-through hole and a second plated-through hole, wherein the first plated-through hole is coupled to the electrically conductive structure, a connecting structure which is arranged on the first side of the carrier, wherein the connecting structure connects the first plated-through hole to the second plated-through hole, the connecting structure having a longitudinal extent which runs parallel to a direction in which a contact-connection device on a reading device is moved relative to the plurality of contacts.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4D shows a front of a further chip card contact array arrangement based on various embodiments;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the detailed description which follows, reference is made to the appended drawings, which form part of the description and which show specific embodiments in which the invention can be executed for the purpose of illustration. In this respect, directional terminology such as "at the top", "at the bottom", "at the front", "at the rear", "front", "rear" etc. is used with reference to the orientation of the figure(s) described. Since components of embodiments can be positioned in a number of different orientations, the directional terminology is used for the purpose of illustration and is in no way restrictive. It goes without saying that other embodiments can be used and structural or logical changes made without departing from the scope of protection of the present invention. It goes without saying that the features of the various embodiments described herein can be combined with one another unless specifically stated otherwise. The following detailed description should therefore not be regarded as restrictive, and the scope of protection of the present invention is defined by the attached claims.

Within the context of this description, the terms "connected" and "coupled" are used to describe both direct and indirect connection, and also direct and indirect coupling. In the figures, identical or similar elements are provided with identical reference symbols, insofar as this is expedient.

Figure 1:
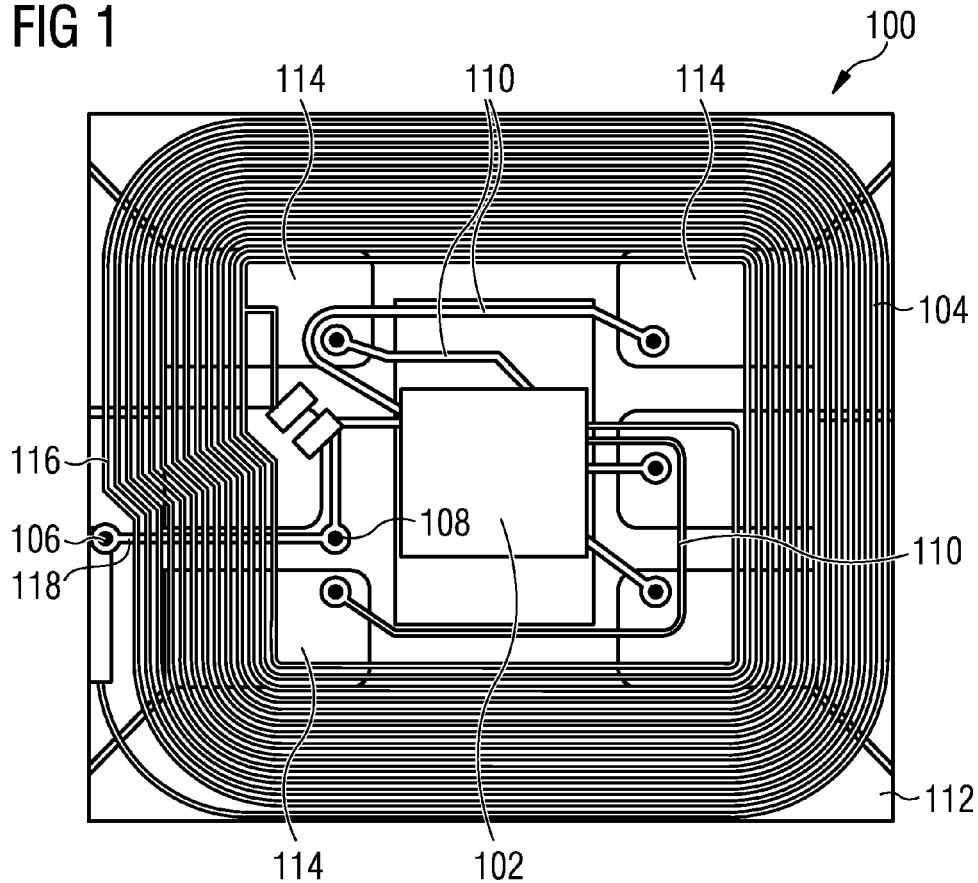
FIG. 1 shows a back of a chip card module based on various embodiments.

FIG. 1 shows a back of a chip card module 100 based on various embodiments. The chip card module 100 has a carrier 112 which holds an integrated circuit in the form of the chip 102. In this embodiment, the carrier 112 is transparent, which means that it is also possible to see the contact arrays or chip card contacts 114 which are arranged on the front of the carrier 112. The chip card contacts 114 are coupled to the chip 102 by means of wiring 110. In this embodiment, the electrically conductive structure is the form of a coil 104 and, in this embodiment, has thirteen turns (but it may generally have any number of turns). The turns of the coil 104 are arranged in a ring around the chip 102. Each of the coil turns has an almost square or rectangular shape with rounded corners, with the left-hand side of the turns in this embodiment having a bend 116, i.e. a profile which deviates from a straight line. The bend 116 prompts a section of the left-hand side of each of the coil turns to be shifted toward the center of the coil 104 and the outer border of the coil 104 to be provided with a region which may contain a first end of a first bushing 106, for example. The design of the coil 104 can be matched to further components which are present on the carrier 112 as required. The shape of the coil turns may differ from the shape shown in FIG. 1 and my have further bends, for example, for example a further bend which shifts the left-hand side of each of the coil turns back to the border of the chip card module 100 again after the region which contains the first end of the first bushing 106, which means that only an indentation is formed at the outer border of the chip card module 100, which indentation contains the first end of the first bushing 106. The turn of the coil 104 which is arranged right on the outside is electrically connected to the first bushing 106 or to the first end of the bushing 106, which end is exposed on the back of the chip card module 100 for the purpose of making electrical contact. A second end of the first bushing 106, which end is exposed on the front of the chip card module 100 for the purpose of making electrical contact, is electrically connected to a connecting structure or contact bridge 118 arranged on the front of the chip card module 100. The contact bridge 118, which runs on the front of the carrier 112, is connected to a second bushing 118 or to a second end of the second bushing 108, which provides a conductive connection between the contact bridge 118 and the wiring 110. The wiring 110 is arranged on the back of the chip card module 100 and is coupled to the chip 102 and to the second bushing 108 or to a first end of the second bushing 108. In this way, the coil 104 or the circuit which has the coil 104 can be closed without the need to set up an additional plane on the back of the carrier 112, which plane would be able to carry a line which crosses the coil turns. The coil 104 shown in FIG. 1 is a unilateral module antenna, i.e. a module antenna which is arranged on one side of the chip card module 100, in this case the back. The turns of the coil 104 may have silver, aluminum, copper, gold and/or alloys thereof or further conductive materials, for example, and may have an interconnect width in the range from 50 µm to 150 µm, for example 80 µm. By way of example, the turns of the coil 104 may be arranged at an interval of approximately 60 µm to approximately 150 µm from one another on the carrier 112. Both parameters—interconnect width and interconnect interval—are parameters which can be customized in respect of the inductance to be achieved with the coil 104, which is an operating parameter of the chip card module antenna.

Figure 2:
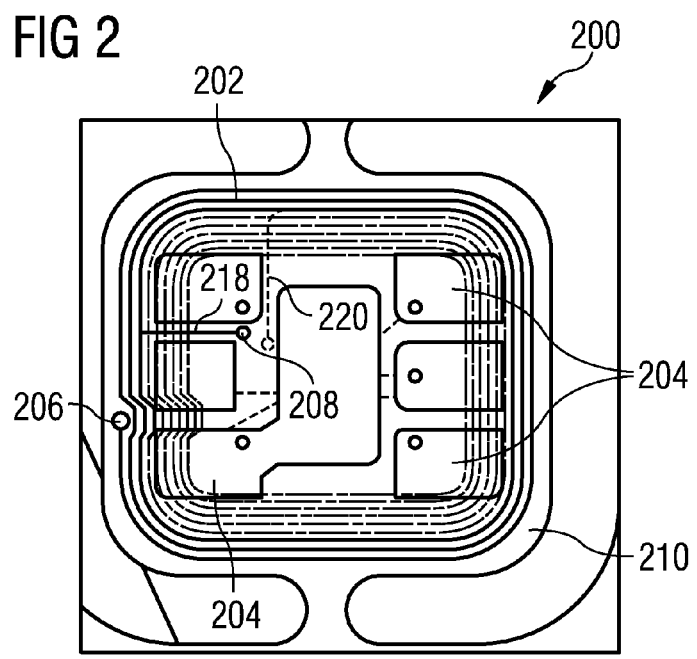
FIG. 2 shows a front of a chip card contact array arrangement based on various embodiments.

FIG. 2 shows a front view of a chip card contact array arrangement 200 based on various embodiments. The front of the chip card contact array arrangement 200 has the chip card contacts 204, which may be arranged in a central region of the carrier 210. In this embodiment, the chip card contact array arrangement 200 has six chip card contacts 204. In contrast to the chip card module 100 shown in FIG. 1, the chip card module 200 in FIG. 2 has a bilateral chip card module antenna. In other words, the coil in this embodiment is arranged both on the back and on the front of the chip card module 200. In FIG. 2, the second end of the first bushing 206 and the second end of the second bushing 208 have further coil turns 202 or a further portion of the coil arranged between them which surround or surrounds the six chip card contacts 204. In other words, that end of the contact bridge 218 which is situated at the border of the chip card module 200 is adjoined by further—in this embodiment 3—coil turns 202, with the end of the outer turn of the further coil turns 202 being electrically connected to the second end of the first bushing 206. By utilizing the front and back of the carrier 210, it is thus possible to construct a compact coil. The contact bridge 218 is arranged between two contact arrays 204, with the longitudinal extent of said contact bridge being arranged in parallel with those edges of these contact arrays 204 which adjoin it. In this case, the contact bridge 218 runs between an outer region and a more inwardly arranged region of the chip card contact array arrangement 200 based on various embodiments. Alternatively, the contact bridge 218 may also be arranged in the free region between the contact arrays 204, for example, which runs below the free region which contains the contact bridge in the chosen embodiment of the chip card contact array arrangement in FIG. 2 or between contact arrays 204 which run on the right-hand side of the chip card contact array arrangement 200 shown in FIG. 2. The contact bridge 218 may also have the alternatively shown profile 220, which is just one further profile from a large number of possible profiles. In principle, the profile of the contact bridge 118 may be determined by many factors, for example the geometry of the contact arrays 204, the size of the free region between the contact arrays 204 and/or the size of the free region between the contact arrays 204 and the border of the chip card contact array arrangement 200 or structures which are arranged on the border of the chip card contact array arrangement 200, for example the additional turns 202 of the coil which are shown by way of example in FIG. 2.

As a further determining factor for the position of the contact bridge 218 on the front of the chip card contact array arrangement 200 based on various embodiments, it is possible to take account of the relative movement between the chip card contact array arrangement 200 based on various embodiments or the chip card based on various embodiments, which has the chip card contact array arrangement 200, and a reading device. Using the example of the chip card contact array arrangement 200 based on various embodiments which is shown in FIG. 2, the profile shown for the contact bridge 218 (horizontal profile of the contact bridge 218) can be chosen, by way of example, when the chip card contact array arrangement 200 is arranged on a chip card such that when the chip card is pushed into a reading device that chip card contact array arrangement 200 is introduced into a contact opening or contact slot by the right-hand border. This may result in contacts of the reading device which slide over the contact arrays 204 of the chip card sliding from right to left over the contact arrays when the chip card is pushed in and being positioned over respective corresponding contact arrays 204 of the chip card contact array arrangement 200 at the end of the relative movement. Since the contact bridge 218 is arranged in the free region between two contact arrays 204 and there is no region with which contact needs to be made arranged behind the contact bridge 218 in the direction of the relative movement that is taking place, it is also highly likely that no contact on the reading device will slide over the contact bridge 218. In other words, the bridge is in this case arranged in a free region between two contact arrays 204 which corresponds to a rear region of the chip card contact array arrangement 200. In various embodiments, the rear region can be understood to mean the region of the chip card contact array arrangement 200 with which contacts on the reading device make contact last in chronological terms when a chip card which has the chip card contact array arrangement is pushed in. By way of example, the rear region may correspond to a region between the center of the chip card contact array arrangement 200 based on various embodiments and the border or the edge of the chip card contact array arrangement 200 which is opposite that border or the edge of the chip card contact array arrangement 200, or is arranged at maximum distance away there from, which is introduced or pushed into a reading device first. By arranging the contact bridge 218 in the rear region, it is possible to minimize or totally prevent material removal or wear on the contact bridge 218. However, should a portion of the reading structure or another element in the reading device be arranged such that during the relative movement it slides over the free region which contains the bridge 218, the material removal in this case occurs in the longitudinal extent of the bridge, which may generally be in a range from approximately 2 mm to 6 mm, depending on the position of the contact bridge. By way of example, this situation may arise when the chip card contact array arrangement 200 in FIG. 2 is pushed into a reading device from right to left and the contact bridge 218 is therefore arranged in proximity to that border or edge of the chip card contact array arrangement 200 which is pushed into the reading device first.

Were the contact bridge 218 to have the alternative profile 220 while retaining the direction just described for the relative movement (left-right orientation in FIG. 2) between the chip card contact array arrangement 200 and the reading device, a contact on the reading device which is intended to make contact with the contact array 204 at the top left or at top right in the view in FIG. 2 could possibly slide over the contact bridge transversely with respect to the longitudinal extent thereof. In this case, the direction of the relative movement between the chip card contact array arrangement 200 and the reading device would run at right angles to the longitudinal extent of the contact bridge with the alternative profile 220. This could prompt material removal from the contact bridge with the alternative profile 220 along its width. Since this dimension can usually have an extent of less than 1 mm, a continually repeating process, such as the pushing of a chip card into a reading device, in which the contact bridge undergoes wear or abrasion along the extent of its width as a smaller dimension in comparison with the longitudinal extent, can adversely affect the life of the contract bridge with the alternative profile 220. In similar fashion to what has been stated above, the alternative profile 220 of the contact bridge, as shown in FIG. 2, can advantageously be chosen when the chip card contact array arrangement 200 in FIG. 2 is pushed into the reading device by the lower or upper edge first, for example. In these cases, material removal from the contact bridge could be avoided entirely or could occur only in the longitudinal extent of the contact bridge with the alternative profile 220. If the chip card contact array arrangement 200 is pushed into a reading device by the lower edge first, the alternative profile 200 of the contact bridge in FIG. 2 furthermore corresponds to an arrangement of the bridge in a rear region of the chip card contact array arrangement 200 which is pushed into the reading device, or has contact made with it by contacts on the reading device, last in chronological terms.

Usually, a chip card contact array arrangement 200 based on various embodiments may be embedded in or arranged on a chip card such that at least two edges of a respective contact array 204 are arranged in parallel with two sides of the chip card, and at least two further edges of the same contact array 204 are arranged in parallel with the two other sides of the chip card. This circumstance can also be reflected in that the edges or borders of the chip card contact array arrangement 200 are each in parallel with the corresponding edges or borders of the chip card. Therefore, the contact bridge 218 may be arranged in parallel with at least one lateral edge of the chip card in various embodiments of a chip card.

Figure 3:
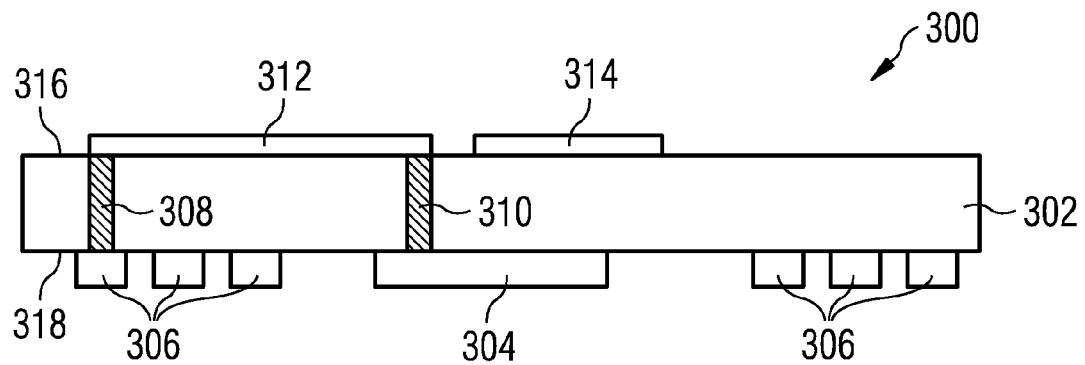
FIG. 3 shows a cross-sectional view of a chip card module based on various embodiments.

FIG. 3 shows a cross-sectional view of a chip card module 300 based on various embodiments. The cross-sectional view shown in FIG. 3 can run along the axis through the chip card contact array arrangement 200 in FIG. 2, which matches the longitudinal extent of the contact bridge 218, the additional turns 202 of the coil which surround the contact arrays 204 on the front not being shown. The chip card module 300 has a carrier 302 which has a front 316 and back 318. The back 318 holds the turns 306 of the coil, which are arranged concentrically around a region which contains the chip 304. The contact bridge 312 arranged on the front 316 runs from an outer region of the front 316 of the chip card module 300 toward the center or toward an inner region 316 of the chip card module 300. The inner region of the front 316 may be arranged essentially above the region on the back 318 of the chip card module 300 which contains the chip 304. The outer turn 306 of the coil is electrically connected to one end of the contact bridge 312 by means of the first bushing 306. The other end of the contact bridge 312 is connected to the chip 304 by means of the second bushing 310. In addition, a contact array 314 is visible on the front 316 of the chip card contact array arrangement 300.

Figure 4A:
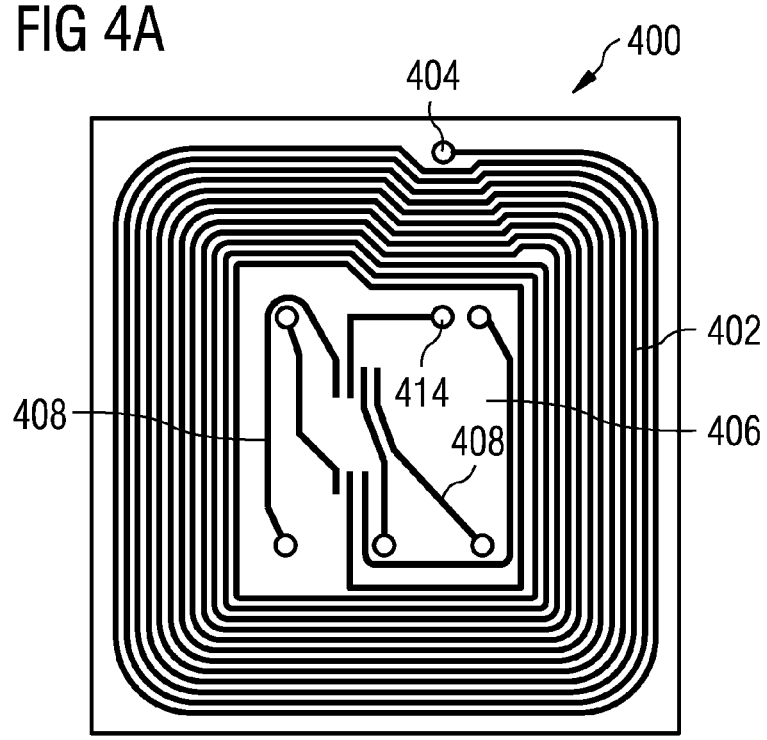
FIG. 4A shows a back of a chip card contact array arrangement based on various embodiments.

FIG. 4A shows a back of a chip card contact array arrangement 400 based on various embodiments which holds a module antenna in the form of a coil which has a number of turns 402. The center of the coil contains a region 406 in which wiring 408 is provided which provides electrical connections between the chip and the contact arrays. The outermost turn of the turns 402 of the coil has its end electrically connected to the first end of the first bushing 404. A point on the wiring 408 is electrically connected to the first end of the second bushing 414.

Figure 4B:
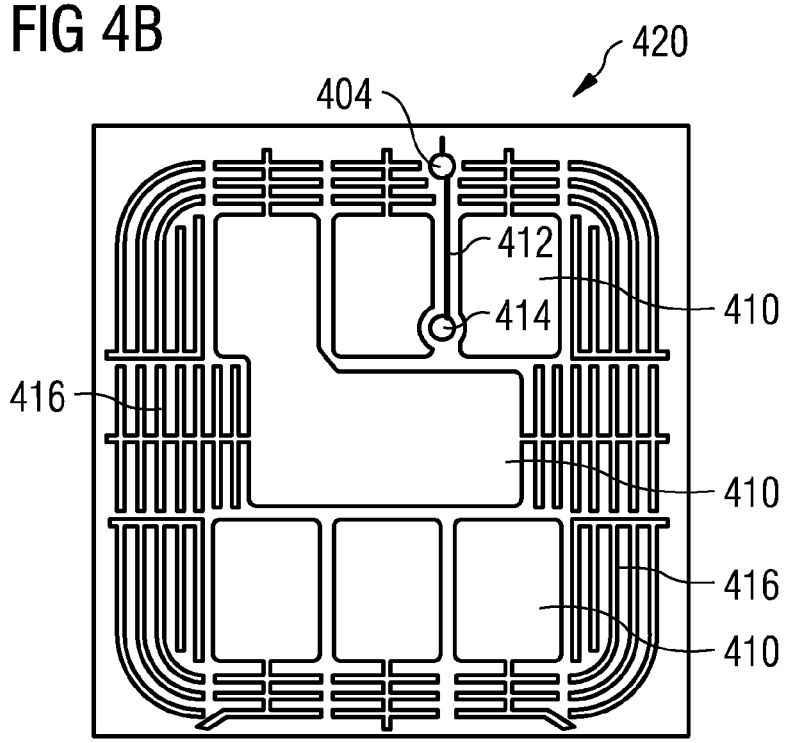
FIG. 4B shows a front of a chip card contact array arrangement based on various embodiments.

FIG. 4B shows an embodiment of a contact array arrangement 420 which may be arranged on the front of the back of the chip card contact array arrangement 400, shown in FIG. 4A. The contact array arrangement 420 has six separate contact arrays 410, the connection and arrangement thereof being able to be based on ISO/IEC standard 7816-2. The contact bridge 412 is arranged between the second end of the first bushing 404 and the second end of the second bushing 414 and is electrically connected to these. In addition, the contact bridge 412 may be arranged in the direction of sliding, i.e. in the direction which may correspond to the direction in which the chip card, which may hold the chip card contact array arrangement, is pushed or inserted into a reading device. In FIG. 4B, the circumstance described would correspond to a relative movement, which takes place vertically in FIG. 4B. As a result, it is possible to prevent the contact bridge 412 from undergoing mechanical wear along its small dimension, that is to say its width, when the chip card is pushed into a reading device, which can have a positive effect on the life of the contact bridge 412 and hence the operability of the chip card contact array arrangement. In addition, border structures 416 are arranged around the contact arrays 410, some of which are respectively connected to one of the adjoining contact arrays 410.

Figure 4C:
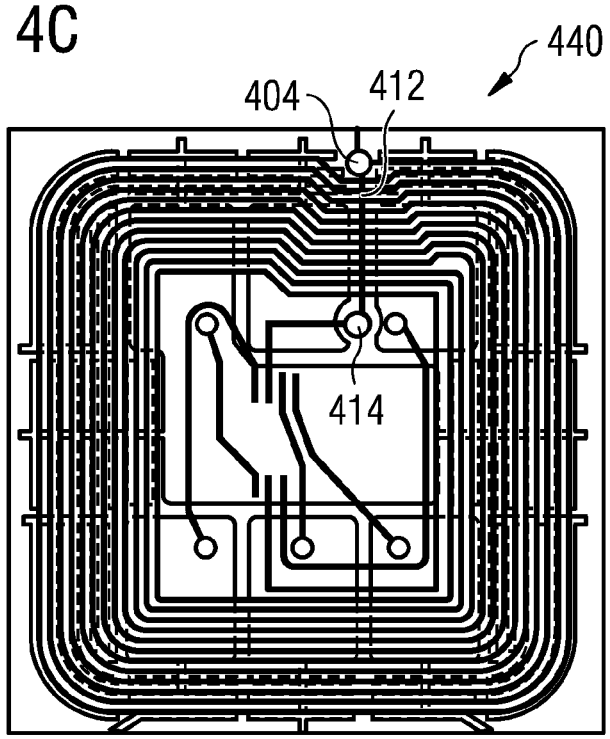
FIG. 4C shows a superimposition of the views of the chip card contact array arrangement which are shown in FIG. 4A and FIG. 4B.

A superimposed view 440 of the view shown in FIG. 4A for the back of the chip card contact array arrangement 400 based on various embodiments and the view shown in FIG. 4B for the contact array arrangement 420 on the front of the chip card module based on various embodiments is shown in FIG. 4C. For the sake of clarity, only a few reference symbols have been transferred from FIG. 4A and FIG. 4B. The superimposed view 440 clearly reveals that the contact bridge 412 arranged on the front of the chip card module is used in order, in interaction with the first bushing 404 and the second bushing 414, to provide an electrically conductive connection between the end of the outer turn of the turns 402 of the coil and the region 406 which contains the chip (not shown in the figures).

A further embodiment of a contact array 460 on a front of a chip card contact array arrangement based on various embodiments is shown in FIG. 4D, which follows the embodiments shown in FIG. 4B, which means that the same reference symbols are used for the same elements. The essential difference is that the border structure 418 (subsequently functional border structure 418) surrounding the upper third of the contact array arrangement 460 is not—in comparison with the further border structures 416 surrounding the contact arrays 410—connected to the adjoining contact arrays 410, but rather is connected to the contact bridge 412 and to the second end of the first bushing 404. The contact bridge 412 is arranged centrally in a free space between two contact arrays 410. The arrangement of the functional border structure 418 is arbitrary, i.e. the further instances of the border structures 416 can be separated from the chip card contacts 410 and coupled to the functional border structure 418. In this case, the functional border structure 418 is in the form of a capacitive element or in the form of a capacitive structure. The capacitive structure 418 arranged on the front of the chip card contact array arrangement can act as an electrode of a capacitor, for example, and the other electrode can be provided by the coil turns of the coil which is arranged on the back of the chip card contact array arrangement based on various embodiments. By way of example, the capacitive structure 418 may, as shown in FIG. 4A have continuous interconnects which are arranged above each and/or every second interconnect or coil. In such a case, a portion of the coil simultaneously forms a portion of the capacitance.

Figure 5A:
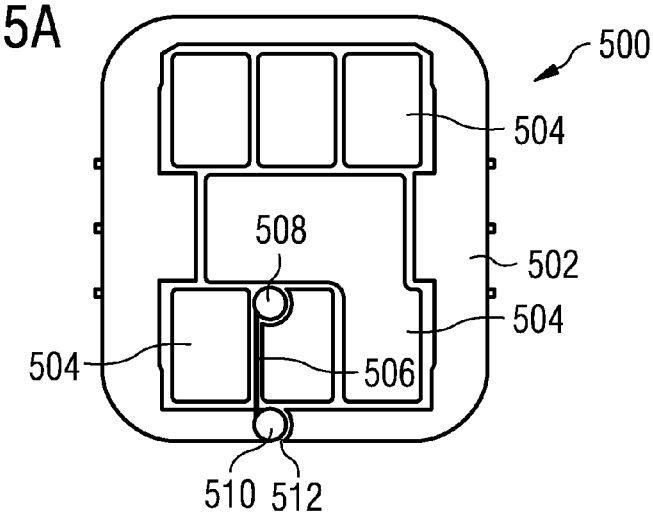
FIG. 5A shows a front view of a further chip card contact array arrangement based on various embodiments.
Figure 5B:
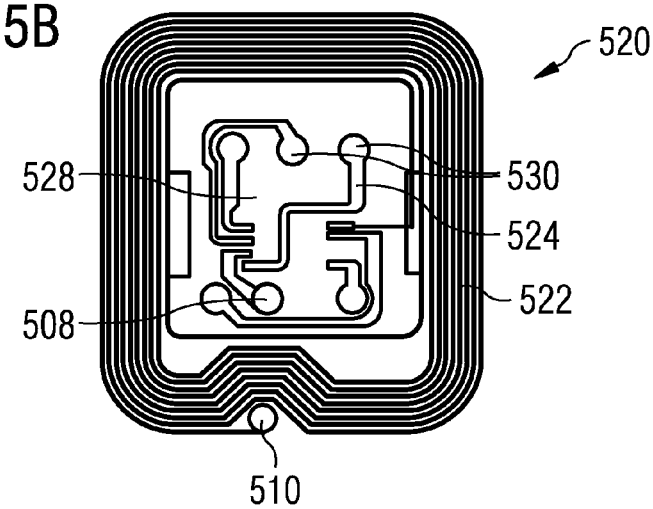
FIG. 5B shows a rear view of the chip card contact array arrangement shown in FIG. 5A based on various embodiments.
Figure 5C:
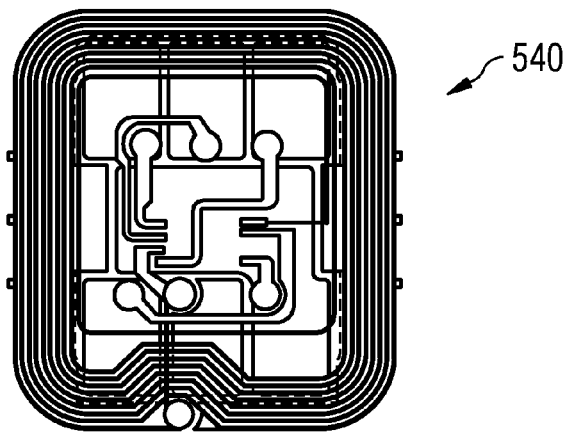
FIG. 5C shows a superimposition of the views of the chip card contact array arrangement which are shown in FIG. 5A and FIG. 5B based on various embodiments.

A further embodiment of a chip card contact array arrangement based on various embodiments is shown in FIG. 5A to FIG. 5C. FIG. 5A shows a front view or plan view of an exemplary chip card contact array arrangement. The front 500 of the chip card contact array arrangement holds the contact arrays 504, the chip card contact array arrangement in this embodiment having six contact arrays 504, the position and size of which may be based on ISO/IEC standard 7816-2, for example. The contact arrays 504 may be surrounded by a border 502 or a bordering structure, with the bounding line on the inside of the border 502 being able to follow the outer contour of a region which has the contact arrays 504, as is the case in FIG. 5A. The border 502 is not closed, i.e. it does not form a structure that is closed around the contact arrays 504, but rather has a gap 512. The border 502 is connected to the first bushing 510 on the front 500 of the chip card contact array arrangement. The first bushing 510 is connected to the second bushing 508 by means of the conductive contact bridge 506 or a conductive web. The second end of the first bushing 510, which is shown in FIG. 5A, and the second end of the second bushing 508 is of oval design, but it may also have other expedient shapes. In addition, the ends of the bushings may have an area which is smaller, larger or the same as the base area of the bushings. At least one of the second ends of the bushings, for example the second end of the second bushing 508, can occupy a portion of the area which is usually occupied by one of the contact arrays 504. In this case, the relevant contact array 504 can be reduced by this portion of the area. The second end of the first bushing 510, the second end of the second bushing 508, the contact bridge 506 and the optional border 502 may form a contiguous, electrically conductive area which is electrically insulated from the contact arrays 504, for example by an appropriate insulating interval.

FIG. 5B shows a back 520 of the exemplary chip card contact array arrangement shown in FIG. 5A. The back 520 holds the coil 522, which may have a number of turns which are arranged in an outer region of the surface of the carrier on the back 520 of the chip card contact array arrangement. The coil 520 may surround an inner region 528 which has the wiring 524 and contacts 530, which together make a connection between the contact arrays 504, which are arranged on the front 500 of the chip card contact array arrangement, and appropriate contacts on the chip when the chip is placed in the inner region 528. From the superimposed illustration 540 of the front view 500 and the rear view 520 of the exemplary chip card contact array arrangement in FIG. 5C, it can be seen that the bridge 506 arranged on the front 500 of the chip card contact array arrangement makes an electrically conductive connection between the outer turn of the coil 522 and the inner region 528. In a transferred sense, the bridge 506 can be used to close the coil 522 or the circuit which has the coil 522 without the need to produce an additional interconnect layer on the back 520 of the chip card contact array arrangement so that a short is produced when the outer turn of the coil 522 is returned to the inner region 528. From the superimposed view 540 in FIG. 5C, it can be seen that the border 502 is arranged above the interconnects of the coil 522 and is connected to the first bushing 510 and to the outer turn of the coil 522. Consequently, the border 502 together with the turns of the coil 522 can provide a capacitive element, the capacitance being able to be maximized by virtue of the bordering structure 502 being produced over the full area. It may be advantageous for the border 502 to be connected to the outer turn, since in this way only the first plated-through hole 510 is required. The latter is present together with the second plated-through hole 508 in order to provide, together with the contact bridge 506, the electrical contact between the outer turn of the coil 522 and the inner region 528. The contact bridge 506 may be arranged between the border 502 and one of the contact arrays 504 or else between two contact arrays 504. By way of example, the contact bridge 506 may be arranged between the border 502 and the contact array 504 on the far left in the lower row within the contact array arrangement in FIG. 5A and may run essentially vertically. Similarly, the contact bridge 506 may be arranged between the second and third contact arrays 504 from the left in the lower row within the contact array arrangement in FIG. 5A or else between the third contact array 504 from the left in the lower row within the contact array arrangement in FIG. 5A and the border 502, likewise running essentially vertically in FIG. 5A. Similarly, the contact bridge 506 may also be provided between a contact array 504 and the border 502 or between contact arrays 504 within the upper row of the contact array arrangement. In other words, the position of the contact bridge 506 within the contact array arrangement can be matched to the respective wiring 524 on the back 520 of the chip card contact array arrangement, for example. As an alternative to the illustration in FIG. 5A to FIG. 5C, the first bushing 510 and the second bushing 508 do not necessarily have to be connected directly to the two ends of the contact bridge 506. Alternatively, the first bushing 510 may be arranged at an arbitrary point above the outer (or inner) turn of the coil 522, for example on the opposite side of the border 502. In order to maximize the life of the chip card contact array arrangement, the following aspect may be considered. The contact bridge 506, which may have a width of between 50 μm and 500 μm, for example, may be more susceptible to mechanical wear in this dimension, said mechanical wear possibly arising as a result of the chip card, which may contain the chip card module based on various embodiments, being pushed through or the chip card being pushed into a reading device, for example. Accordingly, the contact bridge 506 may be arranged such that the direction which indicates the longitudinal extent of the contact bridge 506 (in the embodiment of a chip card contact array arrangement which is illustrated in FIG. 5A to FIG. 5C, the contact bridge 506 runs from the border of the chip card contact array arrangement inward, parallel to the borders of the contact arrays 504 surrounding it) matches the direction in which the chip card is pushed into or pushed through a reading device. This can minimize the risk of appropriate contacts on the reading device sliding over the contact bridge 506 transversely with respect to the longitudinal extent thereof and causing material removal at right angles to the longitudinal extent of the contact bridge 506, that is to say along the width, which may be in the form of the more delicate dimension.

Figure 6A:
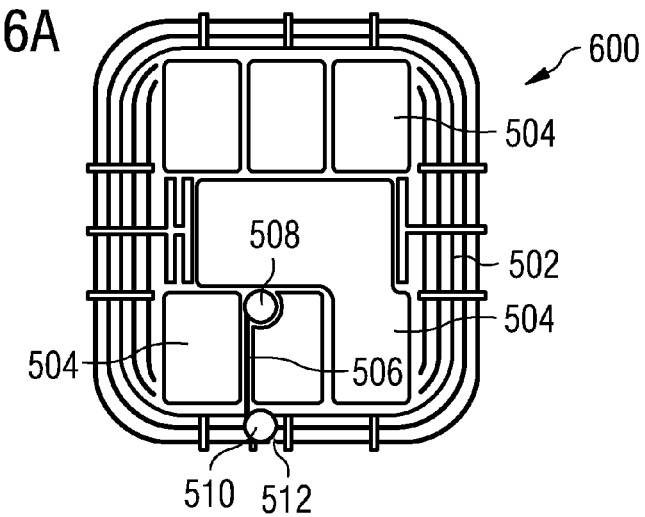
FIG. 6A shows a front view of a further chip card contact array arrangement based on various embodiments.
Figure 6B:
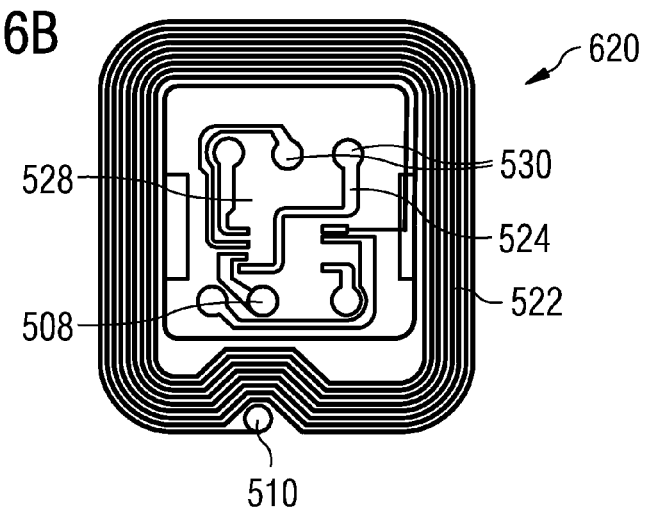
FIG. 6B shows a rear view of the chip card contact array arrangement shown in FIG. 6A based on various embodiments.
Figure 6C:
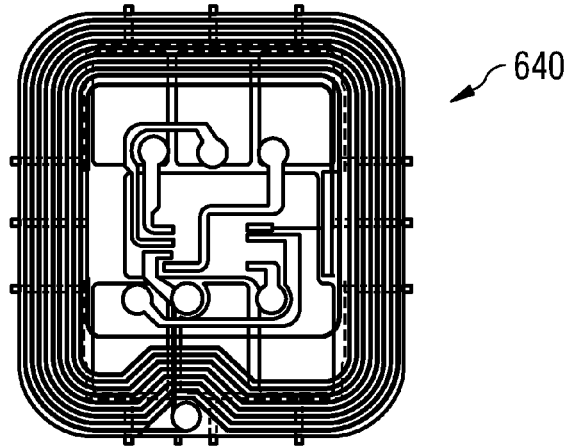
FIG. 6C shows a superimposition of the views of the chip card contact array arrangement which are shown in FIG. 6A and FIG. 6B based on various embodiments.

A further embodiment of a chip card contact array arrangement based on various embodiments is shown in FIG. 6A to FIG. 6C. FIG. 6A shows a front view 600 and FIG. 6B shows a rear view 620 of an exemplary chip card contact array arrangement, and FIG. 6C shows a superimposed view 640 in which the front view 600 from FIG. 6A and the rear view 620 from FIG. 6B are superimposed. The exemplary chip card contact array arrangement shown in FIG. 6A to FIG. 6C essentially corresponds to the exemplary chip card contact array arrangement shown in FIG. 5A to FIG. 5C, which means that components and structures having the same design and function bear the same reference symbols and are not described again. The exemplary chip card contact array arrangement shown in FIG. 6A to FIG. 6C has been modified such that the border 502 is not setup as a full-area conductive structure but rather has a network-like conductive structure, with the network having interconnect turns which surround the contact arrays 504 and are likewise unclosed, but rather are interrupted by means of the gap 512. In this case, the interconnect turns of the border 502 are additionally connected to one another by means of electrically conductive cross-connections. The inner turns of the border 502 may be shortened, i.e. they run only along one or only along a portion of one of the four sides of the contact array arrangement. The network-like border 502 in FIG. 6A provides a capacitive element in precisely the same way as the border 502 in FIG. 5A in interaction with the turns of the coil 522, but with the performance capability of this arrangement being improved in comparison with that of the arrangement shown in FIG. 5A to FIG. 5C. The reduced number of chip card contacts—from eight to six—reduces the surface of the chip card contact array arrangement which is covered with a conductive layer, which means that electromagnetic radiation is shielded from the turns of the coil 522 which are arranged underneath to a lesser extent. Instead of the full-area metal border 502 shown in FIG. 5A and FIG. 5C, the chip card contact array arrangement shown in FIG. 6A to FIG. 6C has a network-like metal border 502, which can additionally reduce a possible shielding effect for electromagnetic radiation in relation to the underlying coil 522.

Figure 7A:
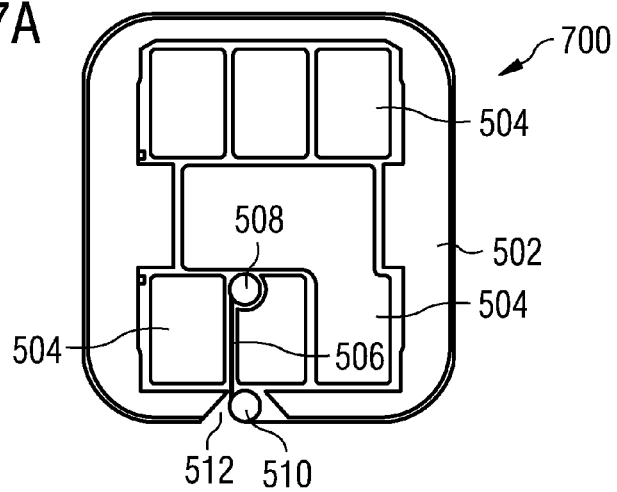
FIG. 7A shows a front view of a further chip card contact array arrangement based on various embodiments.
Figure 7B:
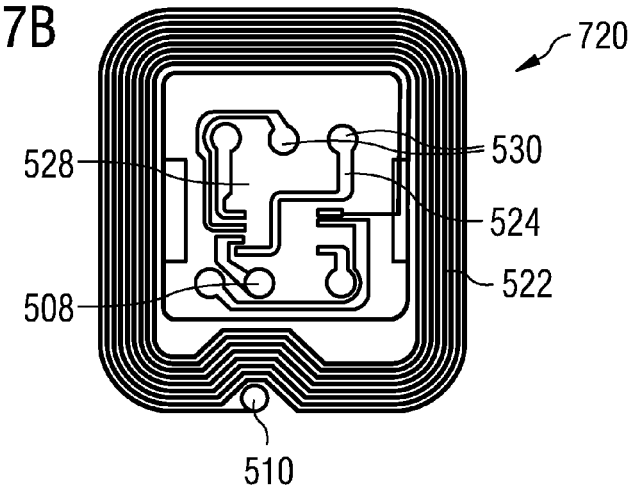
FIG. 7B shows a rear view of the chip card contact array arrangement shown in FIG. 7A based on various embodiments.
Figure 7C:
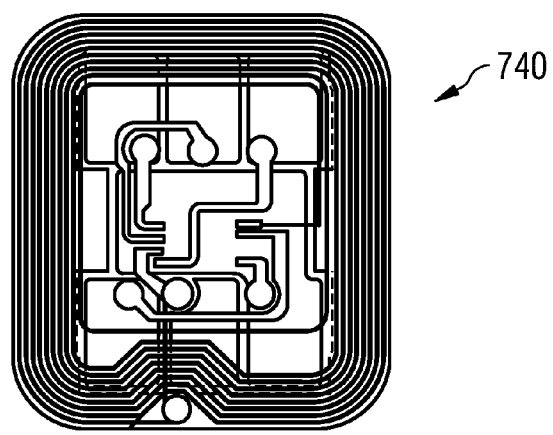
FIG. 7C shows a superimposition of the views of the chip card contact array arrangement which are shown in FIG. 7A and FIG. 7B based on various embodiments.

A further embodiment of a chip card contact array arrangement is shown in FIG. 7A to FIG. 7C. FIG. 7A shows a front view 700 and FIG. 7B shows a rear view 720 of an exemplary chip card contact array arrangement, and FIG. 7C shows an exemplary chip card contact array arrangement in a superimposed view 740, in which the front view 700 from FIG. 7A and the rear view 720 from FIG. 7B are superimposed. The exemplary chip card contact array arrangement shown in FIG. 7A to FIG. 7C essentially corresponds to the exemplary chip card contact array arrangement shown in FIG. 5A to FIG. 5C, which means that components and structures which have the same design and function bear the same reference symbols and are not described again. The exemplary chip card contact array arrangement shown in FIG. 7A to FIG. 7C has been modified, however, such that, in addition to the border 502, at least one turn 702 of the coil 522 is arranged around said border, the order of the two elements being interchangeable, i.e. the at least one turn 702 may also be arranged between the contact array arrangement and the border 502. In this case, at least one additional turn 702 is connected up between the contact bridge 506 and the first bushing 710 and therefore acts as an extended turn of the coil 532. The at least one additional turn 702 on the front 700 of the chip card contact array arrangement can cause the inductance of the coil to be increased. In this arrangement, one end of the at least one additional turn 702 is connected to the first bushing 510, and the other end of the at least one additional turn is connected to the second bushing 508 by means of the contact bridge 506. The exemplary chip card contact array arrangement shown in FIG. 7A to FIG. 7C corresponds to an embodiment in which the contact bridge 506 is not connected to the two bushings directly, since the first bushing 510 and the contact bridge 506 have the at least one additional turn 702 arranged between them.

Figure 8A:
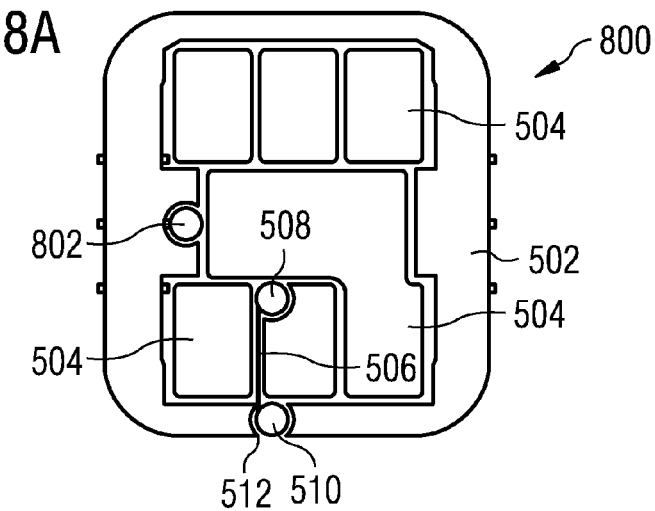
FIG. 8A shows a front view of a further chip card contact array arrangement based on various embodiments.
Figure 8B:
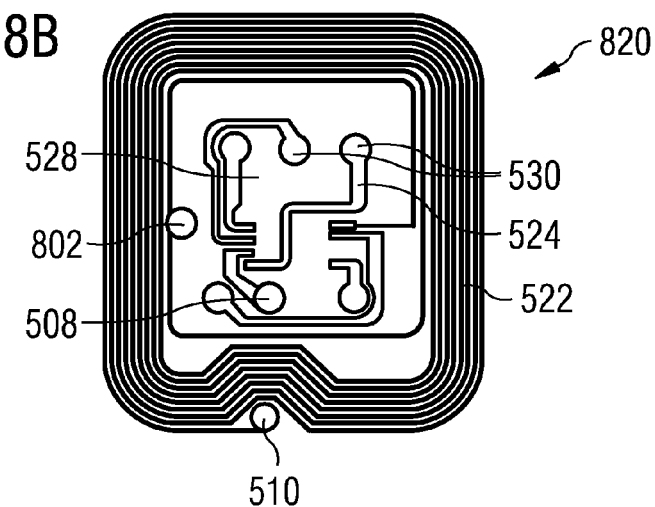
FIG. 8B shows a rear view of the chip card contact array arrangement shown in FIG. 8A based on various embodiments.
Figure 8C:
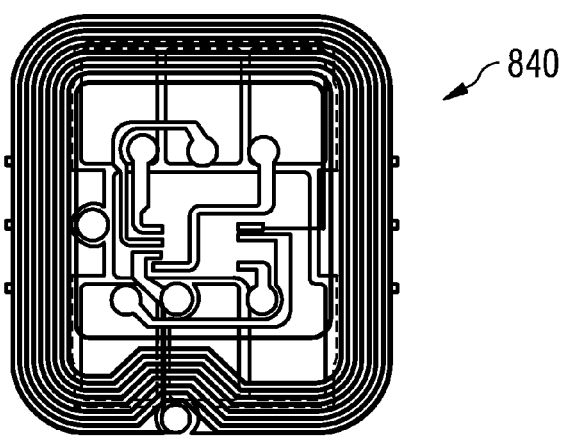
FIG. 8C shows a superimposition of the views of the chip card contact array arrangement which are shown in FIG. 8A and FIG. 8B based on various embodiments.

A further embodiment of a chip card module based on various embodiments is shown in FIG. 8A to FIG. 8C. FIG. 8A shows a front view 800 and FIG. 8B shows a rear view 820 of an exemplary chip card contact array arrangement, and FIG. 8C shows a chip card contact array arrangement in a superimposed view 840, in which the front view 800 from FIG. 8A and the rear view 820 from FIG. 8B are superimposed. The exemplary chip card contact array arrangement shown in FIG. 8A to FIG. 8C essentially corresponds to the exemplary chip card contact array arrangement shown in FIG. 5A to FIG. 5C, which means that components and structures which have the same design and function bear the same reference symbols and are not described again. The exemplary chip card contact array arrangement shown in FIG. 8A to FIG. 8C has been modified, however, such that the border 502 is coupled to an inner turn of the coil 522. In this embodiment, the border 502 is electrically insulated from the unit comprising the first bushing 510, the contact bridge 506 and the second bushing 508, and the gap 512 is in the form of an annular, unclosed free region around the first bushing 512. The connection of the border 502 to the inner turn of the coil 522 is accomplished by means of the additional third bushing 802. The border 502 together with the turns of the coil 522 above which it is arranged form a capacitive structure. In this way, the capacitance can be maximized by maximizing the potential difference, however.

Figure 9A:
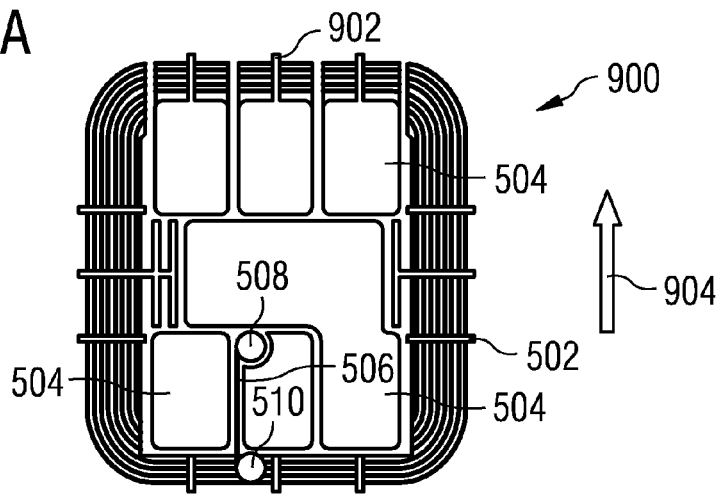
FIG. 9A shows a front view of a further chip card contact array arrangement based on various embodiments.
Figure 9B:
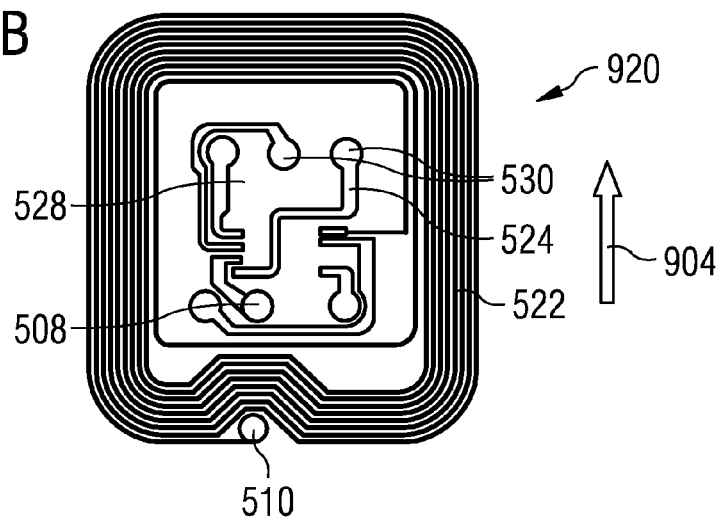
FIG. 9B shows a rear view of the chip card contact array arrangement shown in FIG. 9A based on various embodiments.
Figure 9C:
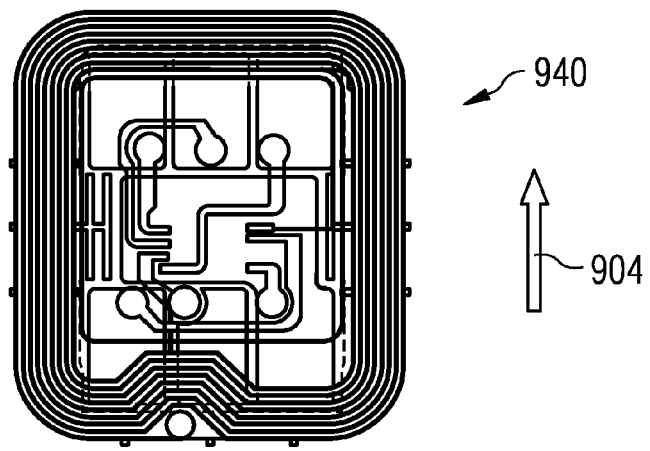
FIG. 9C shows a superimposition of the views of the chip card contact array arrangement which are shown in FIG. 9A and FIG. 9B based on various embodiments.

A further chip card contact array arrangement based on various embodiments is shown in FIG. 9A to FIG. 9C. FIG. 9A shows a front view 900 and FIG. 9B shows a rear view 920 of an exemplary chip card contact array arrangement, and FIG. 9C shows a chip card contact array arrangement in a superimposed view 940, in which the front view 900 from FIG. 9A and the rear view 920 from FIG. 9B are superimposed. The exemplary chip card contact array arrangement shown in FIG. 9A to FIG. 9C essentially corresponds to the exemplary chip card contact array arrangement shown in FIG. 6A to FIG. 6C, which means that components and structures which have the same design and function bear the same reference symbols and are not described again. The exemplary chip card contact array arrangement shown in FIG. 9A to FIG. 9C has been modified, however, such that the network-like border 502 extends essentially along three sides (bottom, left and right in FIG. 9A) of the contact array arrangement. Arranged along the fourth side are extension structures 902, which are each connected to an adjoining contact array 504. In this case, the extension structures 902 are electrically insulated first from one another and also from the border 502 by appropriate insulating intervals. If the chip card contact array arrangement in FIG. 9A to FIG. 9C is pushed into a reading device from bottom to top, that is to say in the direction denoted by an arrow 904, it is possible to avoid a short between adjacent contact arrays 504 which are connected to the extension structures 902 and between the latter and the border 502 when the chip card contact array arrangement, which may be arranged on a chip card, for example, is pushed into the reading device. In a manner similar to the exemplary chip card contact array arrangement illustrated in FIG. 6A to FIG. 6C, the performance capability of this chip card contact array arrangement is improved on account of the reduced shielding of electromagnetic radiation by the network-like border 502 in comparison with the chip card contact array arrangement based on different embodiments which are shown in FIG. 5A to FIG. 5C, which has a border 502 of areal design.

In various embodiments, a chip card contact array arrangement is provided, having a carrier, a plurality of contact arrays which are arranged on a first side of the carrier, an electrically conductive structure which is arranged on a second side of the carrier, which is arranged opposite the first side of the carrier, a first plated-through hole and a second plated-through hole, wherein the first plated-through hole is coupled to the electrically conductive structure, a connecting structure which is arranged on the first side of the carrier, wherein the connecting structure connects the first plated-through hole to the second plated-through hole, the connecting structure having a longitudinal extent which runs parallel to a direction in which a contact-connection device on a reading device is moved relative to the plurality of contacts.

The carrier may have an electrically insulating material, for example a plastic or a plastic laminate, and may be present as a film or a thin layer of material. The individual carrier can be formed by singularization from a continuous belt during the production of chip card contact array arrangements, for example. The carrier may have a dimension which corresponds to the dimension of a milled feature in a chip card body, with the result that the carrier can be inserted into the chip card body properly. In various embodiments, a chip card body may be understood to mean a chip card which may be based on ISO/IEC standard 7810 or ISO/IEC standard 7816, for example, and is not yet connected to or fitted with a chip card contact array arrangement. By way of example, the carrier may have a customary size which meets the requirements for the contact areas or contact arrays in accordance with ISO/IEC standard 7816-2, for example. In various embodiments, a chip card module may be understood to mean the chip card contact array arrangement, which has a chip which is electrically connected to the chip card contact array arrangement.

The contact arrays which are arranged on the front of the carrier, which may correspond to the first side of the carrier, may be based on ISO/IEC standard 7816-2. Hence, the carrier may have eight contact arrays or six contact arrays, which may have customary conductive materials, for example Ag, Au, Al, Cu or mixtures or alloys thereof. The contact arrays may be connected to wiring arranged on the back of the carrier, which may correspond to the second side of the carrier, by means of conductive bushings through the carrier. One end of the electrically conductive structure, which is arranged on the back of the carrier, may be connected to the wiring. The electrically conductive structure may be arranged such that it surrounds the region which contains the wiring and in which the chip can be arranged, for example.

The first plated-through hole, which may have an arbitrary electrically conductive material, may be connected to a section of the electrically conductive structure which is arranged on the outer border of the carrier, for example. The second plated-through hole, which may likewise have an arbitrary electrically conductive material, may be coupled to the wiring. A first end of the electrically conductive structure may be coupled to the wiring, and a second end of the electrically conductive structure may be connected to the first plated-through hole. The two plated-through holes and the connecting structure may be used to provide an electrically conductive connection—arranged on the front of the carrier—between the second end of the electrically conductive structure and the region which contains the wiring.

The connecting structure may be configured as an electrically conductive web or as an electrically conductive contact bridge which provides an electrically conductive connection between the two plated-through holes. The connecting structure may essentially be characterized by a width and a length, the larger dimension being able to correspond to the length. The longitudinal extent of the connecting structure may run parallel to the direction in which a relative movement takes place between the contact arrays of the chip card contact array arrangement and a contact-connection device on a reading device. The contact-connection device on the reading device may be electrical contacts, for example in the form of contact needles, contact heads or contact springs, which are brought into mechanical contact with the contact arrays of the chip card contact array arrangement when communication needs to take place between the chip card contact array arrangement and a reading device. When the chip card contact array arrangement is introduced into a reading device, the contacts on said reading device can slide over the chip card contact arrays of the chip card contact array arrangement. The effect which can be achieved by the arrangement of the longitudinal extent of the connecting structure parallel to the direction of the relative movement just described is that the contact structures on the reading device do not slide over the connecting structure at right angles to the longitudinal extent thereof and hence cause material removal or wear along the width of the connecting structure, which is usually the smaller dimension in comparison with the length.

According to various embodiments of the chip card contact array arrangement, the contact arrays may be arranged on the basis of ISO/IEC standard 7816-2. The areas or shapes of the individual contact arrays may be customized, for example reduced, as required in order to create regions which, by way of example, contain connecting points between the connecting structure and the first plated-through hole and/or second plated-through hole.

On the basis of various embodiments of the chip card contact array arrangement, the carrier may be formed from electrically insulating material.

On the basis of various embodiments of the chip card contact array arrangement, the electrically conductive structure may have a coil. By way of example, the coil may be an arrangement of interconnect turns, with the shape of the individual turns being able to be circular, oval, polygonal with or without rounded corners. The shapes just mentioned are merely exemplary shapes, which means that the shape of the turns of the coil may have other geometric profiles which, by way of example, may be matched to the space requirement and the arrangement of other electrical parts on the back of the carrier in the surroundings of the coil. A first end of the coil may be coupled to the wiring, which may be arranged in the region which is surrounded by the coil. A second end of the coil may be coupled to the first plated-through hole. The coil may be set up to provide a contactless interface for the chip card contact array arrangement by virtue of it being able to couple to electromagnetic fields from a reading unit.

On the basis of various embodiments of the chip card contact array arrangement, at least part of the connecting structure may run beside at least one contact array. In this case, the connecting structure may always be electrically insulated from the at least one contact array, for example by means of an insulating interval in the order of magnitude of approximately 50 µm to 1 mm. In this case, the connecting structure may run from an outer region of the carrier or from an outer region of all of the contact arrays (subsequently: contact array arrangement) to the center of the carrier or to the center of the contact array arrangement.

On the basis of various embodiments of the chip card contact array arrangement, at least part of the connecting structure may also run between two contact arrays. In this case, the width of the connecting structure may match the interval between the contact arrays, with the result that there is an insulating interval between the connecting structure and each of the adjacent contact arrays.

On the basis of various embodiments of the chip card contact array arrangement, the connecting structure may have a width in a range of approximately 50 µm to 500 µm.

On the basis of various embodiments of the chip card contact array arrangement, the connecting structure may be electrically insulated from the contact arrays. This can be accomplished by the aforementioned insulating interval. In addition, the region between the connecting structure and the adjoining contact array(s) may have an electrically insulating material provided in it, for example a ceramic or a plastic.

On the basis of various embodiments of the chip card contact array arrangement, at least part of the connecting structure in one region may be arranged beside at least one contact array which, when the chip card contact array arrangement is introduced into a reading device, is chronologically the last brought into the proximity of contacts on the reading device. If the chip card contact array arrangement is arranged on a chip card body, for example, which is pushed into a slot or an opening in the reading device, the region which, when the chip card contact array arrangement is introduced, is chronologically the last brought into the proximity of contacts on the reading device may correspond to a subregion of the chip card contact array arrangement which is arranged in a half of the chip card contact array arrangement which adjoins a border of the chip card contact array arrangement which is arranged at a maximum distance away from the border of the chip card body which is introduced into the slot in the reading device first.

In various embodiments, a chip card module is provided which may have a chip card contact array arrangement based on various embodiments and a chip that is coupled to the chip card contact array arrangement. The chip may have an integrated circuit and may be coupled to the chip card contact array arrangement by means of the wiring.

The chip card module based on various embodiments may be set up such that it can be embedded into chip cards which comply with a standard, for example ISO/IEC standard 7810 and/or ISO/IEC standard 7816. On the basis of various embodiments, the chip card module may have further electronic components, for example capacitances and/or resistors and/or further coils, in addition to the chip and the electrically conductive structure. The chip card module may have a size which, by way of example, meets the requirements for the contact areas or contact arrays based on ISO/IEC standard 7816-2.

On the basis of various embodiments of the chip card module, the chip may be arranged on the same side of the carrier as the electrically conductive structure. By way of example, the chip may be arranged together with the electrically conductive structure in the form of a coil on the back of the chip card module which corresponds to the back of the chip card contact array arrangement, and may be arranged in a region which is surrounded by the coil.

In various embodiments, a chip card is provided which has a chip card module based on various embodiments. In the chip card based on various embodiments, the communication between the chip card and a reading device can take place on a contact basis and/or contactlessly, that is to say that the chip card may be configured as a dual interface chip card. The chip card based on various embodiments may comply with ISO/IEC standard 7810 and/or with ISO/IEC standard 7816. Accordingly, the chip card based on various embodiments may have one of the customary size formats ID-1, ID-2, ID-3, ID-000 (also called mini-SIM format, SIM: Subscriber Identity Module) or 3FF (also called micro-SIM format). Depending on the size of the chip card, it may also have more than one chip card module. By way of example, there may be two chip card modules arranged on a chip card, with the result that the chip card may have one of its ends pushed into a reading device or can be swiped through such a reading device, and the user is thus able to select which chip card module has made contact with it and hence is intended to be used. The chip card based on various embodiments may have customary materials used for chip card production such as PVC (polyvinyl chloride), ABS (acrylonitrile butadiene styrene), PC (polycarbonate), PET (polyethylene terephthalate) or mixtures thereof.

In various embodiments, a chip card arrangement is provided which has a reading device and a chip card based on various embodiments. The communication between the reading device and the chip card can take place on a contact basis or contactlessly in this context. In the first case, the reading device may have appropriate contacts, for example in the form of contact needles, contact heads or contact springs, which can be brought into physical and hence electrical contact with the contact arrays of the chip card. To this end, the chip card can first of all be pushed into an appropriate contact opening or a contact slot in the reading device, for example. A relative movement can take place between the contact arrays of the chip card and the contacts of the reading device, with the contacts of the reading device being able to slide over a border region of the chip card when the chip card is pushed into the contact slot, and then being able to be guided over the chip card in sliding fashion to their final position, in which they are arranged over appropriate contact arrays of the chip card contact array arrangement. In the case of contactless communication, the reading device may have an antenna which can be used to exchange electromagnetic waves with the coil of the chip card contact array arrangement based on various embodiments. The reading device may have both interfaces, with the result that either the contactless interface or the contact-based interface can be chosen for the communication between the reading device and chip card based on various embodiments.

In various embodiments, a chip card is provided which has a chip card module carrier and a chip card module, wherein the chip card module has a chip card contact array arrangement and a chip coupled to the chip card contact array arrangement, with the chip card contact array arrangement having: a carrier, a plurality of contact arrays which are arranged on a first side of the carrier, an electrically conductive structure which is arranged on a second side of the carrier, which is arranged opposite the first side of the carrier, a first plated-through hole and a second plated-through hole, wherein the first plated-through hole is coupled to the electrically conductive structure, a connecting structure which is arranged on the first side of the carrier, wherein the connecting structure connects the first plated-through hole to the second plated-through hole, the connecting structure having a longitudinal extent which runs parallel to a lateral edge of the chip card module carrier. In various embodiments, a chip card module carrier may be understood to mean a chip card body which is not yet fitted with a chip card module. Accordingly, the chip card module carrier may have one of the customary formats determined in ISO/IEC standard 7810, for example, such as ID-1, ID-2, ID-3, ID-000 or 3FF, which have essentially rectangular shapes with two pairs of two respective parallel lateral edges, with at least one corner being able to be rounded and/or at least one corner being able to be beveled. The connecting structure, which is arranged on the first side of the carrier, for example the front, may have a longitudinal extent which runs parallel to a lateral edge of the chip card module carrier, for example parallel to one of the long lateral edges. The contact arrays on the front of the chip card may—according to ISO/IEC standard 7816—have at least two groups of lateral edges, the lateral edges in a group being able to run parallel to one of the lateral edges of the chip card module carrier and hence parallel to one of the lateral edges of the chip card in each case. In various further embodiments of the chip card, the longitudinal extent of the connecting structure may be arranged parallel to at least one lateral edge of at least one of the contact arrays and parallel to at least one lateral edge of the chip card module carrier or the chip card.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip card contact array arrangement, comprising:
   a carrier;
   a plurality of contact arrays which are arranged on a first side of the carrier;
   an electrically conductive structure which is arranged on a second side of the carrier, which is arranged opposite the first side of the carrier;
   a first plated-through hole and a second plated-through hole;
   wherein the first plated-through hole is coupled to the electrically conductive structure;
   a connecting structure which is arranged on the first side of the carrier, wherein the connecting structure connects the first plated-through hole to the second plated-through hole; and
   the connecting structure having a longitudinal extent which runs parallel to a direction in which a contact-connection device on a reading device is moved relative to the plurality of contacts.

2. The chip card contact array arrangement as claimed in claim 1,
   wherein the contact arrays are arranged on the basis of ISO/IEC 7816-2.

3. The chip card contact array arrangement as claimed in claim 1,
   wherein the carrier is formed from electrically insulating material.

4. The chip card contact array arrangement as claimed in claim 1,
   wherein the electrically conductive structure has a coil.

5. The chip card contact array arrangement as claimed in claim 1,
   wherein at least part of the connecting structure runs beside at least one contact array.

6. The chip card contact array arrangement as claimed in claim 1,
   wherein at least part of the connecting structure runs between two contact arrays.

7. The chip card contact array arrangement as claimed in claim 1,
   wherein the connecting structure has a width in a range from approximately 50 µm to approximately 500 µm.

8. The chip card contact array arrangement as claimed in claim 1,
   wherein the connecting structure is electrically insulated from the contact arrays.

9. The chip card contact array arrangement as claimed in claim 1,
wherein at least part of the connecting structure in one region is arranged beside at least one contact array which, when the chip card contact array arrangement is introduced into a reading device, is chronologically the last brought into the proximity of contacts on the reading device.

10. A chip card module, comprising:
a chip card contact array arrangement, comprising:
a carrier;
a plurality of contact arrays which are arranged on a first side of the carrier;
an electrically conductive structure which is arranged on a second side of the carrier, which is arranged opposite the first side of the carrier;
a first plated-through hole and a second plated-through hole;
wherein the first plated-through hole is coupled to the electrically conductive structure;
a connecting structure which is arranged on the first side of the carrier, wherein the connecting structure connects the first plated-through hole to the second plated-through hole; and
the connecting structure having a longitudinal extent which runs parallel to a direction in which a contact-connection device on a reading device is moved relative to the plurality of contacts;
a chip coupled to the chip card contact array arrangement.

11. The chip card module as claimed in claim 10,
wherein the chip is arranged on the same side of the carrier as the electrically conductive structure.

12. A chip card, comprising:
a chip card module, comprising:
a chip card contact array arrangement, comprising:
a carrier;
a plurality of contact arrays which are arranged on a first side of the carrier;
an electrically conductive structure which is arranged on a second side of the carrier, which is arranged opposite the first side of the carrier;
a first plated-through hole and a second plated-through hole;
wherein the first plated-through hole is coupled to the electrically conductive structure;
a connecting structure which is arranged on the first side of the carrier, wherein the connecting structure connects the first plated-through hole to the second plated-through hole; and
the connecting structure having a longitudinal extent which runs parallel to a direction in which a contact-connection device on a reading device is moved relative to the plurality of contacts;
a chip coupled to the chip card contact array arrangement.

13. A chip card arrangement, comprising:
a reading device; and
a chip card, comprising:
a chip card module, comprising:
a chip card contact array arrangement, comprising:
a carrier;
a plurality of contact arrays which are arranged on a first side of the carrier;
an electrically conductive structure which is arranged on a second side of the carrier, which is arranged opposite the first side of the carrier;
a first plated-through hole and a second plated-through hole;
wherein the first plated-through hole is coupled to the electrically conductive structure;
a connecting structure which is arranged on the first side of the carrier, wherein the connecting structure connects the first plated-through hole to the second plated-through hole; and
the connecting structure having a longitudinal extent which runs parallel to a direction in which a contact-connection device on a reading device is moved relative to the plurality of contacts;
a chip coupled to the chip card contact array arrangement.

14. A chip card, comprising:
a chip card module carrier; and
a chip card module, having a chip card contact array arrangement and a chip coupled to the chip card contact array arrangement;
wherein the chip card contact array arrangement has:
a carrier;
a plurality of contact arrays which are arranged on a first side of the carrier;
an electrically conductive structure which is arranged on a second side of the carrier, which is arranged opposite the first side of the carrier;
a first plated-through hole and a second plated-through hole;
wherein the first plated-through hole is coupled to the electrically conductive structure;
a connecting structure which is arranged on the first side of the carrier, wherein the connecting structure connects the first plated-through hole to the second plated-through hole;
the connecting structure having a longitudinal extent which runs parallel to a lateral edge of the chip card module carrier.

* * * * *